(12) United States Patent
Honma

(10) Patent No.: US 6,788,484 B2
(45) Date of Patent: Sep. 7, 2004

(54) PLL CIRCUIT, DATA DETECTION CIRCUIT AND DISK APPARATUS

(75) Inventor: Hiromi Honma, Tokyo (JP)

(73) Assignee: NEC Corporation (JP)

( * ) Notice: Subject to any disclaimer, the term of this patent is extended or adjusted under 35 U.S.C. 154(b) by 313 days.

(21) Appl. No.: 10/020,850

(22) Filed: Dec. 7, 2001

(65) Prior Publication Data

US 2002/0071194 A1 Jun. 13, 2002

(30) Foreign Application Priority Data

Dec. 7, 2000 (JP) ........................................ 2000-372472

(51) Int. Cl.[7] ............................ G11B 5/09; G11B 20/10
(52) U.S. Cl. .............................. 360/51; 360/32; 360/39; 360/65; 360/31; 360/55; 360/27; 369/47; 369/47.18; 369/59.16; 369/59.18; 369/59.19; 369/59.2; 369/59.21
(58) Field of Search ................................ 369/47, 47.18, 369/59.16, 59.17, 59.18, 59.19, 59.21, 124.05, 124.13; 360/59.22, 27, 29, 30, 32, 39, 51, 55, 40, 46, 31, 77.08, 65

(56) References Cited

U.S. PATENT DOCUMENTS

| | | | | |
|---|---|---|---|---|
| 5,469,415 A | * | 11/1995 | Fujita et al. | 369/47.17 |
| 5,517,476 A | * | 5/1996 | Hayashi | 369/59.22 |
| 5,666,341 A | * | 9/1997 | Horibe et al. | 369/47.28 |
| 5,677,802 A | * | 10/1997 | Saiki et al. | 360/51 |
| 6,097,685 A | * | 8/2000 | Yamaguchi et al. | 369/59.22 |
| 6,208,481 B1 | * | 3/2001 | Spurbeck et al. | 360/65 |

FOREIGN PATENT DOCUMENTS

| | | | | |
|---|---|---|---|---|
| JP | 10-172250 | 6/1998 | ........... | G11B/20/14 |
| JP | 2000-182335 | 6/2000 | ........... | G11B/20/14 |

OTHER PUBLICATIONS

Viterbi, A., "Convolutional Codes and Their Performance in Communications Systems", IEEE Transactions on Communications Technology, vol. COM–19 No. 5, Oct. 1971, pps 751–772.

Honma, H. et al, "High density land/groove recording using PRML technology", Proceedings Reprint, SPIE– The International Society for Optical Engineering, vol. 2338, May 1994, pps 314–318.

* cited by examiner

Primary Examiner—David Hudspeth
Assistant Examiner—Natalia Figueroa
(74) Attorney, Agent, or Firm—Hayes Soloway P.C.

(57) ABSTRACT

A PLL circuit is disclosed which extracts phase difference information of a high S/N ratio from a readout signal uses the phase difference information for PLL control. An A/D converter samples the input signal to produce a digital signal. A pattern string detector identifies a type of an input pattern string formed from a plurality of successive sample values successively outputted from the A/D converter and outputs pattern string identification information which indicates an identification result. A phase difference generator outputs phase difference information which indicates a phase error of the output of the A/D converter based on the pattern string identification information and the output of the A/D converter. A loop filter, a D/A converter and a voltage controlled oscillator generate a clock signal from the phase difference information to control the sampling timing of the A/D converter.

32 Claims, 11 Drawing Sheets

WHEN THE INCLINATION IS POSITIVE
AND THE PHASE DELAYS, $\phi_n < 0$

WHEN THE INCLINATION IS POSITIVE
AND THE PHASE LEADS, $\phi_n > 0$

WHEN THE INCLINATION IS POSITIVE
AND THE PHASE DELAYS, $\phi_n < 0$

WHEN THE INCLINATION IS POSITIVE
AND THE PHASE LEADS, $\phi_n > 0$

PLL CIRCUIT, DATA DETECTION CIRCUIT AND DISK APPARATUS

BACKGROUND OF THE INVENTION

1. Field of the Invention

The present invention relates to a PLL circuit for generating a clock signal from an input signal, a data detection circuit for identifying and playing back information in an input signal using a PLL circuit, and a disk apparatus such as a magnetic disk apparatus or an optical disk apparatus for playing back information recorded on a magnetic disk or an optical disk using a data detection circuit.

2. Description of the Related Art

Owing to the development of the information technology and the start of ground wave digital broadcasting in recent years and so forth, it is demanded to store and edit a large amount of information including video information. As a storage apparatus for storing such a large amount of information, an optical disk apparatus, a magnetic disk apparatus, a magnetic tape apparatus and like apparatus are used. However, the optical disk apparatus is most superior if editing, random accessing and the durability are taken into consideration. However, an existing DVD (Digital Versatile Disk) apparatus does not have a sufficient capacity for continuous recording of a program of BS (Broadcasting Satellite) digital broadcasting because the DVD has a limited capacity of approximately 5 GB (gigabytes) for one face thereof. Therefore, much effort is directed to investigation for the increase of the capacity of a disk apparatus.

It is a problem to the increase of the recording density of an optical disk and a magnetic disk that, as the recording density increases, the intersymbol interference of the readout signal increases, and this decreases the S/N (signal to noise) ratio of the signal and increases the error rate of the detection information. In order to solve the problem to realize high density recording of the optical disk, decrease of the wavelength of a laser beam, increase of the numerical aperture (NA) and the super-resolution (magnetism, light or medium) are used principally. The techniques just mentioned are directed to decrease of the diameter of a converged beam spot to reduce the influence of the intersymbol interference. Meanwhile, in order to increase the recording density of the magnetic disk, use of a GMR (Giant Magneto-Resistive) head and contact recording are used principally. Also the techniques just mentioned are directed to decrease of the intersymbol interference similarly to those for the optical disk.

The techniques given above, however, have a compatibility problem and an apparatus cost problem. On the other hand, a method of increasing the recording density through PRML (Partial Response Maximum Likelihood) detection which positively utilizes the intersymbol interference has been proposed, and this technique is progressively applied to disk apparatus on the market. Since the technique of increasing the recording density by PRML detection digitally processes a readout signal to raise the detection performance, the compatibility can be assured and also a rise of the cost can be suppressed through application of the LSI technology. The technique is further advantageous in that it can be combined with another technique for increasing the recording density.

The PRML is a detection method which uses PR (Partial Response) a combination of waveform equalization and maximum likelihood detection, and it is well known that the PRML has a high playback performance even from a high density recorded playback waveform having a deteriorated resolution by using maximum likelihood detection based on an intersymbol interference amount of a playback channel. For example, a document *Proc. SPIE*, vol. 2338, pp.314–318 discloses an optical disk to which the PRML is applied. Where the PRML is applied to an optical disk, a readout signal read out from the optical disk is waveform equalized in advance so that it may be a signal of a particular PR channel and is then converted into digital information by an A/D (Analog to Digital) converter of 8 bits or the like. Naturally, digital equalization may be performed after such A/D conversion. Waveform data after such equalization have a correlation to preceding and following sample values and can be represented in a state transition diagram. A maximum likelihood detector has the state transition incorporated therein and, even if the S/N ratio of time series input data is low, can detect information with a low error rate by selecting such time series input data which satisfies the state transition and besides exhibits a minimum error.

To determine a pattern string of a maximum likelihood from all possible combinations on an actual circuit is difficult in terms of the circuit scale and the working speed. Therefore, such determination is usually realized by performing selection of a path step by step using an algorithm called Viterbi algorithm disclosed in a document *IEEE Transaction on Communication*, VOL. COM-19, October 1971. A detector which implements the Viterbi algorithm is called Viterbi detector.

A pulse formation circuit including the PRML detection and digital circuits connected to the pulse formation circuit such as an ECC (Error Correction Code) decoder operate in synchronism with a clock, and therefore, a clock signal is required. Since a readout signal of a disk apparatus has a synchronizing clock signal whose frequency is varied by uneven rotation of the spindle or by a very small inclination of the disk, usually a feedback control circuit called PLL (Phase-Locked Loop) for extracting a variation amount from the readout signal to allow follow-up control is required. Conventionally, the PLL is formed using edge position information of a binary pulse signal obtained by threshold detection of an input waveform with a certain threshold level.

However, as the intersymbol interference of the readout signal increases as the recording density onto a disk increases, a problem appears that jitters (fluctuations in time) of the binary pulse signal increase, resulting in, in the worst case, cancellation of the phase locked state of the PLL. Although a large number of simulation results that have a good detection performance, even when a low resolution an input waveform of a low resolution is obtained by the PRML, have been reported, they are based on the premise that a clock signal can be extracted accurately from within the readout signal. However, when the clock signal includes a lot of jitter or when PLL locking is cancelled, wrong information is outputted. In other words, in high density recording/playback, the detection performance of the detector, e.g., such as a PRML detector, relies much upon the follow-up performance of the PLL.

A PLL circuit which satisfies the request for improvement in PLL follow-up performance is disclosed in Japanese Patent Laid-Open No. 2000-182335 or Japanese Patent Laid-Open No. 172250/1998. The PLL circuit disclosed in Japanese Patent Laid-Open NO. 2000-181335 is shown in FIG. 16. Referring to FIG. 16, the PLL circuit includes an equalizer 101 for converting the waveform of an input signal into a waveform of a desired frequency characteristic, an A/D converter 102 for converting the output signal of the equalizer 101 into a digital signal and outputting the digital signal at a timing of a predetermined clock signal, a phase comparator 103 for extracting phase information of the input signal from the output signal of the A/D converter 102 using a plurality of threshold values set in advance, a loop filter 104 for integrating the phase information outputted from the phase comparator 103, a voltage controlled oscillator 105 for outputting the predetermined clock signal whose oscillation frequency is controlled in accordance with an output signal of the loop filter 104, and a maximum likelihood detector 106 for detecting information included in the output signal of the A/D converter 102.

In short, the PLL circuit disclosed in Japanese Patent Laid-Open No. 2000-182335 generates phase information from a plurality of pieces of threshold detection information generated from a plurality of different threshold values to form a phase-locked loop while phase information is conventionally generated based on a threshold detection pulse signal using a single threshold value. The PLL circuit thereby improves the SIN ratio of the output of the phase comparator to improve the PLL follow-up performance.

The PLL circuit disclosed in Japanese Patent Laid-Open NO. 172250/1998 is shown in FIG. 17. Referring to FIG. 17, the PLL circuit includes an A/D conversion circuit 201 for converting an analog signal into a digital signal, an equalizer 202 for equalizing a signal waveform outputted from the A/D conversion circuit 201, a Viterbi detector 203 for discriminating the value of the digital signal waveform-equalized by the equalizer 202 and outputting a digital information signal, a provisional discrimination section 204 for provisionally discriminating a maximum likely value of the digital information signal through maximum likelihood detection and outputting a value corresponding to an amplitude error based on a result of the provisional discrimination, a D/A conversion circuit 205 for converting an output of the provisional discrimination section 204 into an analog signal, a filter 206 for integrating an output of the D/A conversion circuit 205, and a voltage controlled oscillator 207 for controlling the sampling frequency of the A/D conversion circuit 201 based on the error signal from the filter 206.

In short, the PLL circuit disclosed in Japanese Patent Laid-Open NO. 172250/1998 provisionally discriminates through maximum likelihood detection to which one of the reference levels the digital input information is nearest and generates phase information based on the provisional discrimination value and the input signal to form a PLL loop. Consequently, the PLL circuit removes information, which is outputted in error because of noise or the like, from within a phase comparison output based on an ordinary threshold detection pulse signal to improve the S/N ratio of the phase comparator.

However, with the PLL circuit disclosed on Japanese Patent Laid-Open No. 2000-182335, since the distance between adjacent threshold levels decreases as the order of the PR channel becomes higher, there is a problem that the PLL follow-up property is varied significantly by a small amount of offset level variation or the non-linearity of the waveform. Further, from the characteristic of the PR channel, as the order number increases, the absolute value of the differential coefficient of a waveform which passes a certain reference level differs much depending upon preceding and following patterns. Accordingly, there is another problem that, even if the phase displacement is equal, the detection edge timing differs.

Also with the PLL circuit disclosed in Japanese Patent Laid-Open No. 172250/1998, when a high-order PR channel is adopted similarly, since phase information generated from data which is discriminated to have a certain reference level differs significantly depending upon preceding and following patterns, there is a problem that the S/N ratio of phase information is deteriorated. Such problems as described above occur not only with a PLL circuit but also with a data detection circuit which uses a PLL circuit and a disk apparatus which uses a PLL circuit.

SUMMARY OF THE INVENTION

It is an object of the present invention to provide a PLL circuit which suffers less likely from follow-up jitters.

It is another object of the present invention to provide a data detection circuit which has a good follow-up characteristic and can detect data accurately.

It is a further object of the present invention to provide a disk apparatus which has a good follow-up characteristic and achieves high density recording and promotion in reliability of playback information.

In order to attain the objects described above, according to the present invention, phase error information of an S/N ratio as high as possible is extracted from a readout signal having a deteriorated resolution and used for PLL control.

More particularly, according to an aspect of the present invention, there is provided a PLL circuit for generating a clock signal from an input analog signal, comprising an A/D converter for sampling the input analog signal to produce a digital signal, a pattern string detector for identifying a type of an input pattern string formed from a plurality of successive sample values successively outputted from the A/D converter and outputting pattern string identification information which indicates an identification result, a phase difference generator for outputting phase difference information which indicates a phase error of the output of the A/D converter based on the pattern string identification information and the output of the A/D converter, and control means for generating a clock signal from the phase difference information to control the sampling timing of the A/D converter.

The PLL circuit is thus characterized in that it is estimated by the pattern string detector what type of pattern string an input pattern string of a predetermined length is and a differential coefficient at a sample point is generated based on the pattern string identification discrimination and used to generate phase difference information. Since the phase difference information is generated based on the differential coefficient, sensitive phase difference information is outputted in the proximity of a steep edge whereas little phase different information is outputted where the differential coefficient approaches zero. Accordingly, the PLL circuit can generate or extract phase difference information which is tough against noise and has a high S/N ratio accurately from almost all input sample values. Since the PLL loop is formed based on the phase error information, the PLL circuit can achieve a high follow-up performance.

Preferably, the PLL circuit further comprises an analog equalizer provided in the preceding stage to the A/D converter for performing waveform equalization of the input analog signal. The follow-up performance of the PLL loop can be improved by the analog equalizer.

According to another aspect of the present invention, there is provided a PLL circuit for generating a clock signal from an input analog signal, comprising an A/D converter for sampling the input analog signal at a fixed clock rate to produce a digital signal, an interpolator for adjusting the phase of the digital signal, a pattern string detector for identifying a type of an input pattern string formed from a plurality of successive data values successively outputted from the interpolator and outputting pattern string identification information which indicates an identification result, a phase difference generator for outputting phase difference information which indicates a phase error of the output of the interpolator based on the pattern string identification information and the output of the interpolator, and an interpolation amount calculator for controlling the phase adjustment amount of the interpolator based on the phase difference information.

With the PLL circuit, since it comprises the interpolator, pattern string detector, phase difference generator and interpolation amount calculator, it can be formed as a fully digital PLL circuit which exhibits a good follow-up characteristic.

Preferably, the PLL circuit further comprises a digital equalizer provided between the A/D converter and the interpolator for performing waveform equalization of the output signal of the A/D converter. The follow-up performance of the PLL loop can be improved by the analog equalizer.

In each of the PLL circuits, the pattern string detector may include an error generator for calculating error amounts between the input pattern string and all of ideal pattern strings which the input pattern string can assume, and a minimum value detector for outputting the pattern string identification information representing that the ideal pattern string whose calculated error amount is minimum is an ideal pattern string nearest to the input pattern string.

In this instance, the phase difference generator may include a first memory for storing in advance an ideal value within each of the ideal pattern strings and outputting, when the pattern string identification information is inputted, an ideal value corresponding to the ideal pattern string identification information, and a second memory for storing in advance a differential coefficient of each of the ideal values and outputting, when the pattern string identification information is inputted, a coefficient corresponding to the ideal pattern string identification information, a subtractor for subtracting the ideal value outputted from the first memory from the output of the A/D converter or the output of the interpolator, and a multiplier for multiplying an output of the subtractor by the differential coefficient outputted from the second memory and outputting a result of the multiplication as the phase difference information.

Each of the PLL circuits may further comprise an adder provided between the A/D converter and the pattern string detector and phase difference generator for adding an offset correction amount to the output of the A/D converter and outputting a result of the addition to the pattern string detector and the phase difference generator, and an offset amount learning circuit for learning the offset correction amount to be used to correct the offset amount of the output of the adder from the output of the adder and supplying the learned offset correction amount to the adder. The stability of the PLL loop can be stabilized by the provision of the adder and the offset amount learning circuit.

According to a further aspect of the present invention, there is provided a data detection circuit, comprising any of the PLL circuits recited as above, and a pulse formation circuit for identifying information within the output signal of the A/D converter in synchronism with the clock signal generated by the PLL circuit or the clock signal of the fixed clock.

The application of any of the PLL circuits to the data detection circuit makes it possible for the data detection circuit to exhibit its performance to the utmost.

The pulse formation circuit may include a Viterbi detector. In this instance, preferably the data detection circuit further comprises a reference level learning circuit for learning a reference level of the Viterbi detector from the input and output of the Viterbi detector and outputting the learned reference level to the Viterbi detector and the pattern string detector. The provision of the reference level learning circuit allows correction of a non-linearity or the like of a readout signal which fluctuates comparatively slowly. Consequently, information can be detected further stably.

Preferably, the Viterbi detector is ready for a PR (a, b, b, a) channel and specifically for a PR (a, b, c, b, a) channel.

According to a still further aspect of the present invention, there is provided a magnetic or optical disk apparatus comprising a playback system for a magnetic or optical disk in which the data detection circuit is incorporated. The utilization of the data detection circuit contributes to higher density recording or augmentation of the reliability of playback information of the disk apparatus.

The above and other objects, features and advantages of the present invention will become apparent from the following description and the appended claims, taken in conjunction with the accompanying drawings in which like parts or elements are denoted by like reference symbols.

DESCRIPTION OF THE PREFERRED EMBODIMENT

Embodiment 1

Figure 1:
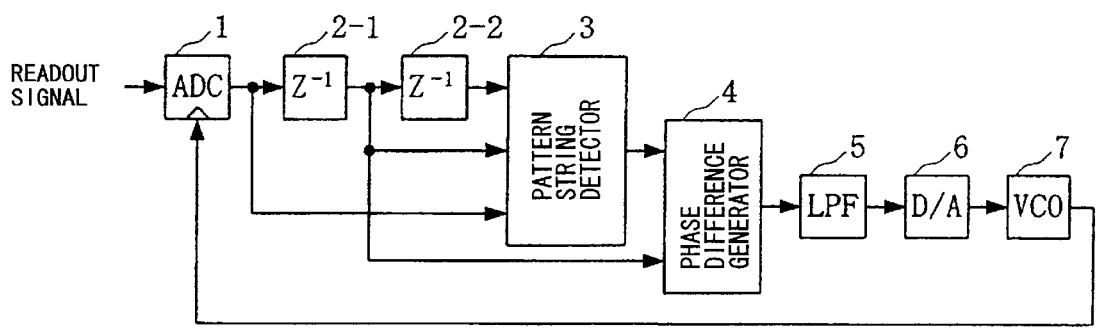
FIG. 1 is a block diagram showing a configuration of a PLL circuit to which the present invention is applied.

Referring first to FIG. 1, there is shown a configuration of a PLL circuit to which the present invention is applied. The PLL circuit shown includes an A/D converter (ADC) 1, delay circuits ($Z^{-1}$) 2-1 and 2—2, a pattern string detector 3, a phase difference generator 4, a loop filter (LPF) 5, a D/A converter 6, and a voltage controlled oscillator (VCO) 7.

An analog input signal (readout signal) read out from, for example, a disk or the like is converted into a digital signal string by the A/D converter 1. In this instance, the A/D converter 1 samples the analog signal in synchronism with a clock signal from the voltage control oscillator 7. An output signal of the A/D converter 1 is successively inputted to the delay circuits 2-1 and 2—2. The output signal of the A/D converter 1 and output signals of the delay circuits 2-1 and 2—2 are inputted to the pattern string detector 3 so that information of successive 3 samples is inputted to the pattern string detector 3. More particularly, information preceding by 2 clocks which has passed the delay circuits 2-1 and 2—2, information preceding by 1 clock which has passed only the delay circuit 2-1, and information which does not pass the delay circuits 2-1 and 2—2 as yet are inputted to the pattern string detector 3. While the configuration of FIG. 1 performs pattern detection for information of successive 3 samples, the sample number may be 5 samples (using four delay circuits) or 7 samples (using six delay circuits).

Figure 2:
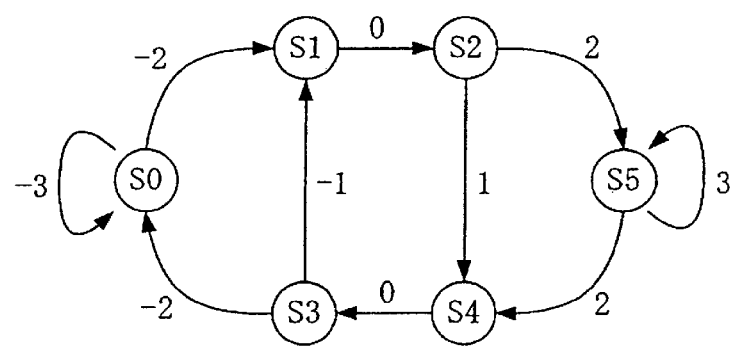
FIG. 2 is a diagrammatic view illustrating a state transition of a d=1 limit PR (1, 2, 2, 1) channel.

If it is assumed that a signal (d=1 limit) of a PR (1, 2, 2, 1) channel shown in FIG. 2 is inputted as a signal of an input channel, then the pattern string detector 3 discriminates whether the input pattern string $(X_{n-1}, X_n, X_{n+1})$ is (3, 3, 3) or (3, 2, 0). In the state transition illustrated in FIG. 2, twenty 3-successive sample patterns are available as given bellow:

(−3, −3, −3), (−3, −3, −2), (−3, −2, 0), (−2, 0, 2), (−2, 0, 1), (−1, 0, 2), (−1, 0, 1), (0, 2, 3), (0, 2, 2), (0, 1, 0), (3, 3, 3), (3, 3, 2), (3, 2, 0), (2, 0, −2), (2, 0, −1), (1, 0, −2), (1, 0, −1), (0, −2, −3), (0, −2, −2), and (0, −1, 0).

The pattern string detector 3 detects a pattern string nearest to the inputted pattern string from among the twenty types of 3-successive sample patterns. Accordingly, since the output of the pattern string detector 3 exhibits one of the twenty types of 3-successive sample patterns, it can be represented sufficiently with 5 bits. The pattern string identification information outputted from the pattern string detector 3 is inputted to the phase difference generator 4. The phase difference generator 4 generates phase difference information based on the output of the pattern string detector 3.

The loop filter 5 integrates the phase difference information outputted from the phase difference generator 4 to convert it into frequency information. The D/A converter 6 converts the output of the loop filter 5 into an analog signal. The voltage-controlled oscillator 7 generates a clock signal having a frequency which increases in proportion to the input level from the D/A converter 6 and controls the sampling timing of the A/D converter 1.

Also the delay circuits 2-1 and 2—2, pattern string detector 3, phase difference generator 4, loop filter 5, and D/A converter 6 which are digital circuits operate in synchronism with a clock signal (not shown) from the voltage control oscillator. The D/A converter 6 may alternatively be provided in the preceding stage to the loop filter 5.

Figure 3:
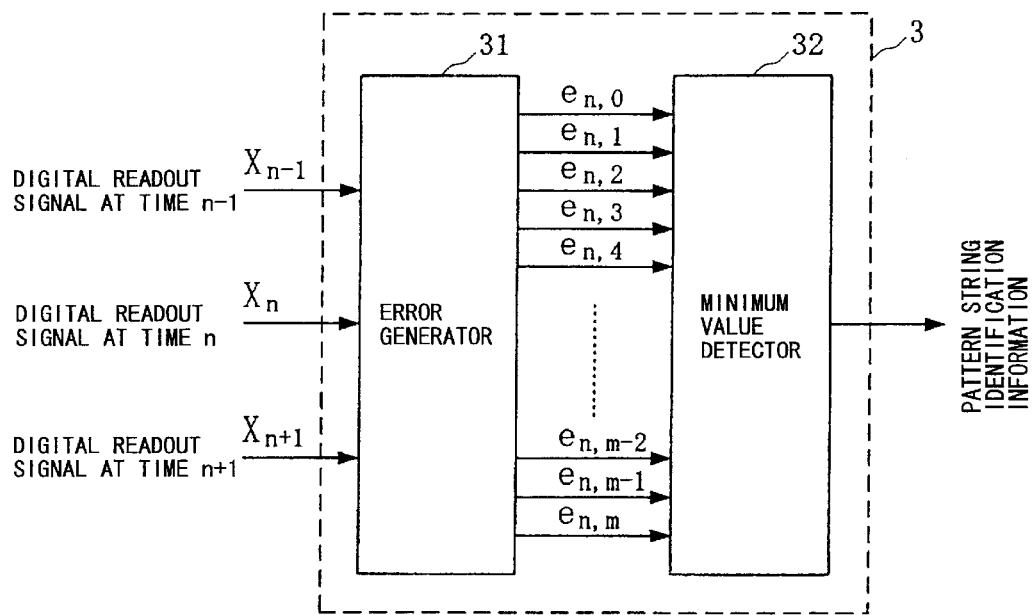
FIG. 3 is a block diagram showing a configuration of a pattern string detector of the PLL circuit of FIG. 1.

FIG. 3 shows an example of a configuration of the pattern string detector 3. Referring to FIG. 3, the pattern string detector 3 includes an error generator 31 and a minimum value detector 32. Operation of the pattern string detector 3 is described with reference to a state transition diagram of FIG. 2.

First, a square average error $E_{n,i}$ between the input pattern string $(X_{n-1}, X_n, X_{n+1})$ and an ideal pattern string is determined in accordance with an equation (1) given below:

$$E_{n,i}=(X_{n-1}-P_{n-1,i})^2+(X_n-P_{n,i})^2+(X_{n+1}-P_{n+1,i})^2 \quad (1)$$

where $P_{n,i}$ represents a central ideal value of the ith ideal pattern string at time n. The twenty types of 3-successive sample patterns (ideal pattern strings) can be represented by $(P_{n-1,i}, P_{n,i}, P_{n+1,i})$ (i represents integers from 1 to 20). Further, in the equation (1) above, $E_{n,i}$ represents a square average error when the ith ideal pattern string is selected at time n.

If the operation of the pattern string detector 3 is considered, the absolute value of an error is not necessary, but only a difference in magnitude is necessary. Consequently, simplification of the equation is possible. In particular, since the terms of square of the input pattern X are common to all error amounts, they need not be calculated. Therefore, a new error amount for comparison is determined in accordance with an equation (2) given below:

$$e_{n,i}=(P_{n-1,i}^2+P_{n,i}^2+P_{n+1,i}^2)/2-(X_{n-1}P_{n-1,i}+X_nP_{n,i}+X_{n+1}P_{n+1,i}) \quad (2)$$

Since the central ideal value $P_{n,i}$ is a fixed value, if the equation (2) is used, then the error generator 31 can be implemented by a circuit for constant multiplication and constant addition. However, when the central ideal value $P_{n,i}$ is to be changed by learning, since a multiplication circuit of parameters is necessary, the scale of the circuit of the error generator 31 increases.

In this manner, the error generator 31 of the pattern string detector 3 calculates and outputs the error $e_{n,i}$ between the input pattern string $(X_{n-1}, X_n, X_{n+1})$ and the ideal pattern string $(P_{n-1,i}, P_{n,i}, P_{n+1,i})$ at time n. Accordingly, in the embodiment, since calculation is performed with regard to the twenty types of the ideal pattern strings, m in FIG. 3 is m=19.

The minimum value detector 32 detects an ideal pattern string nearest to the input pattern string by detecting a minimum value from among the twenty different error amounts $e_{n,i}$ generated by the error generator 31. The minimum value detector 32 outputs pattern string identification information of 5 bits indicating what numbered pattern string the ideal pattern string which has the minimum error amount $e_{n,i}$ is.

Figure 4:
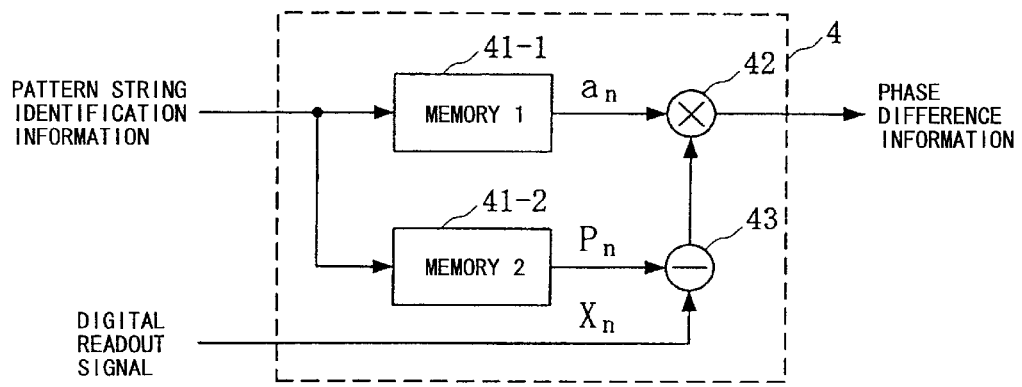
FIG. 4 is a block diagram showing a configuration of a phase difference generator of the PLL circuit of FIG. 1.

FIG. 4 shows an example of a configuration of the phase difference generator 4. Referring to FIG. 4, the phase difference generator 4 includes a first memory 41-1, a second memory 41-2, a multiplier 42, and a subtractor 43. The first memory 41-1 has an ideal sample value $p_n$ stored therein for every ideal pattern string in advance. The second memory 41-2 has a differential coefficient (differential value) $a_n$ of the ideal sample value $p_n$ stored therein for every ideal pattern string in advance.

If pattern string identification information is inputted from the pattern string detector 3, then the first memory 41-1 outputs a corresponding ideal sample value $p_n$. Similarly, if pattern string identification information is inputted from the pattern string detector 3, then the second memory 41-2 outputs a corresponding differential coefficient $a_n$.

Phase difference information $\phi_n$ to be outputted from the phase difference generator 4 is calculated from the ideal sample value $p_n$ the differential coefficient $a_n$, and an input sample value (output of the delay circuit 2-1) $X_n$ in accordance with an equation (3) given below:

$$\phi_n=(X_n-P_n)\times a_n \quad (3)$$

In particular, the subtractor 43 subtracts the ideal sample value $P_n$ from the input sample value $X_n$ and outputs a subtraction result. The multiplier 42 multiplies the subtraction result by the differential coefficient $a_n$ and outputs the phase difference information $\phi_n$.

Figure 5A:
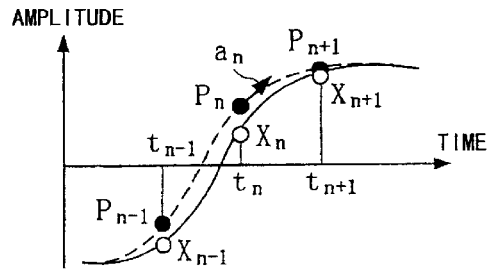
FIGS. 5A to 5D are diagrams illustrating a principle of phase difference generation.
Figure 5B:
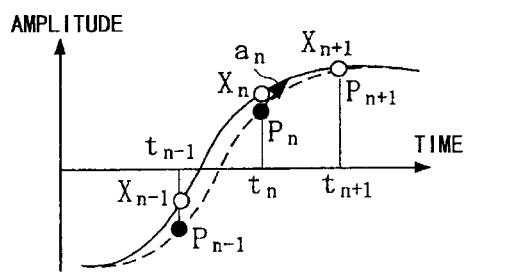
Figure 5C:
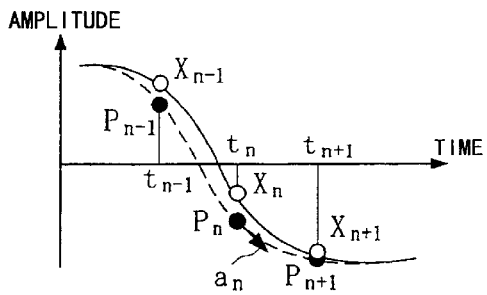
Figure 5D:
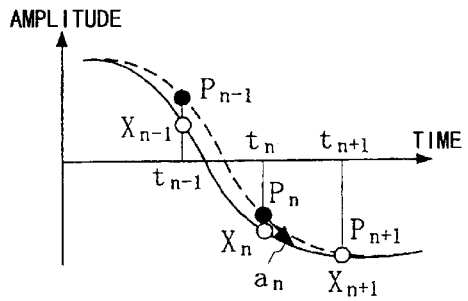

FIGS. 5A to 5D illustrate a principle of the phase difference generation. In particular, FIG. 5A shows a rising edge of an input sample value when the phase exhibits a delay; FIG. 5B shows a rising edge of an input sample value when the phase exhibits a lead; FIG. 5C shows a falling edge of an input sample value when the phase exhibits a delay; and FIG. 5D shows a falling edge of an input sample value when the phase exhibits a lead. In FIGS. 5A to 5D, a blank circle indicates an input sample value $X_n$, and a dark circle indicates an ideal sample value $P_n$.

As seen from FIGS. 5A to 5D, if the input sample value $X_n$ exhibits a delay in phase with respect to the ideal sample value $P_n$ at any of a rising edge and a falling, then the phase difference information $\phi_n$ has the negative sign. On the contrary, if the input sample value $X_n$ exhibits a lead in phase, then the phase difference information $\phi_n$ has the positive sign. This represents that the phase difference information $\phi_n$ can be utilized as phase comparison information.

The higher the absolute value of the differential coefficient, the more certain the phase information, and as the absolute value of the differential coefficient approaches 0, the information amount decreases. The certainty as such phase information is realized by multiplication of the ideal differential coefficient $a_n$. If it is discriminated that the differential coefficient $a_n$ is 0, then the output of the phase difference generator 4 exhibits the value 0 and a wrong output by noise or the like can be prevented. Further, since it is possible to embed information that, even if the ideal sample value $p_n$ is equal in value, the differential coefficient $a_n$ differs depending upon the preceding and following patterns, there is an advantage that a more likely phase comparison output can be obtained.

Figure 6:
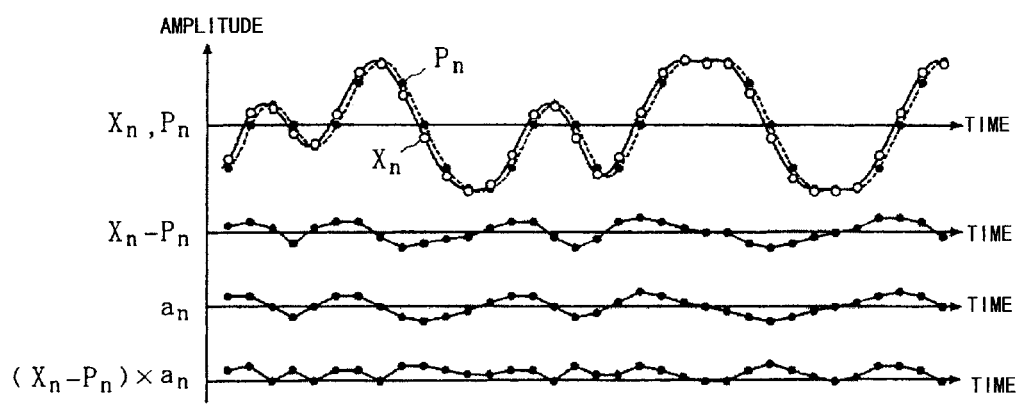
FIG. 6 is a waveform diagram illustrating an example of operation of the phase difference generator of FIG. 4.

FIG. 6 is a signal waveform diagram illustrating signal outputs of the phase difference generator 4 when the input sample value $X_n$ exhibits a lead in phase with respect to the ideal sample value $P_n$. In FIG. 6, $X_n-P_n$ represents the output of the subtractor 43, the differential coefficient $a_n$ represents the output of the memory 41, and $(X_n-P_n) \times a_n$, represents the output of the multiplier 42. From FIG. 6, it can be seen that the phase difference information $\phi_n$ can be generated from all sample points other than sample points at which the differential coefficient $a_n$ of the ideal sample value $P_n$ has the value 0.

Figure 7:
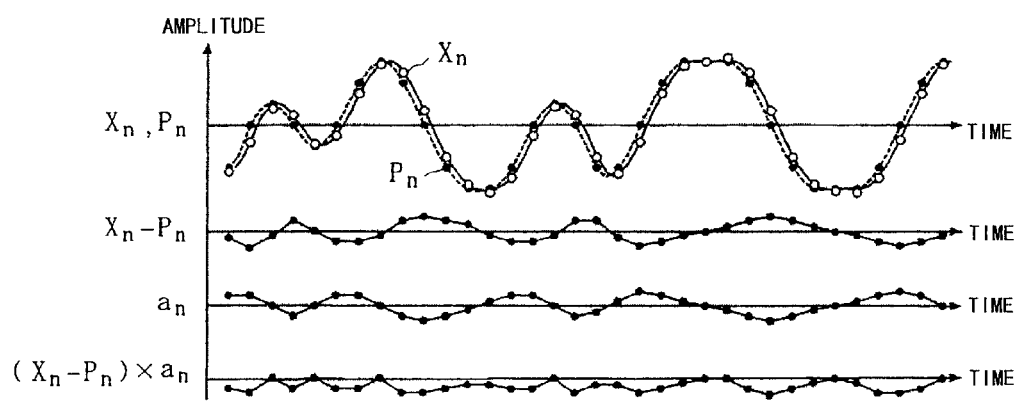
FIG. 7 is a similar view but illustrating another example of operation of the phase difference generator of FIG. 4.

FIG. 7 is a signal waveform diagram illustrating signal outputs of the phase difference generator 4 when the input sample value $X_n$ exhibits a delay in phase with respect to the ideal sample value $P_n$. Similarly as in the case of FIG. 6, from FIG. 7, it can be seen that the phase difference information $\phi_n$ can be generated from all sample points other than sample points at which the differential coefficient $a_n$ of the ideal sample value $P_n$ has the value 0.

From the foregoing, the S/N ratio of the phase difference information can be improved, and the follow-up performance of the PLL loop can be improved.

[Embodiment 2]

Figure 8:
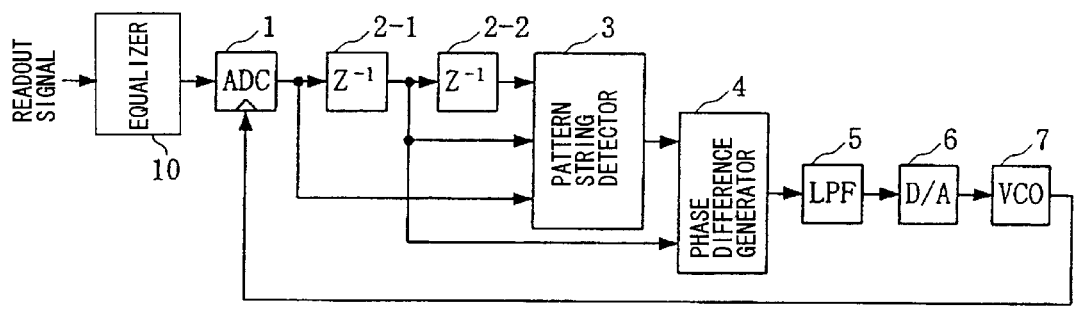
FIGS. 8 to 11 are block diagrams showing different configurations of a PLL circuit to which the present invention is applied.

FIG. 8 shows another configuration of the PLL circuit to which the present invention is applied. Referring to FIG. 8, the PLL circuit shown is a modification to the PLL circuit described hereinabove with reference to FIG. 1 and includes all components of the PLL circuit of FIG. 1. However, the present PLL circuit is different from the PLL circuit of FIG. 1 in that it additionally includes an equalizer 10 provided in the preceding stage to the A/D converter 1 in order to correct the channel characteristic. A readout signal in most cases has a channel characteristic displaced a little from a PR channel. In such an instance, the follow-up performance may possibly be raised by correcting the channel characteristic by means of the equalizer 10.

[Embodiment 3]

Figure 9:
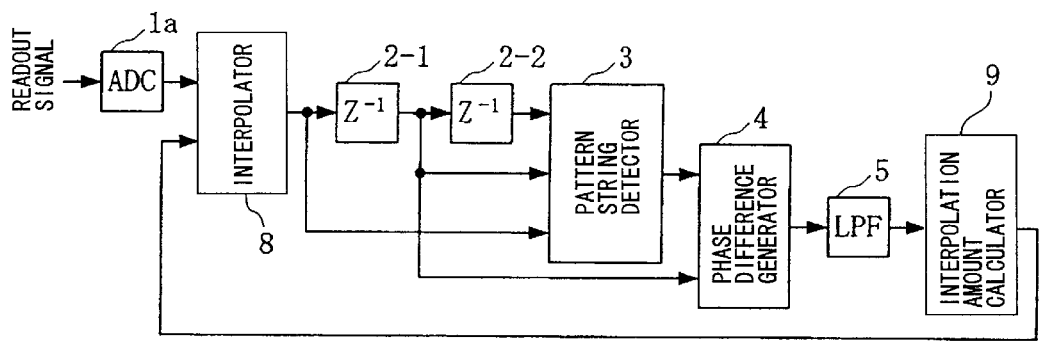

FIG. 9 shows a further configuration of the PLL circuit to which the present invention is applied. Referring to FIG. 9, also the PLL circuit shown is a modification to but is different from the PLL circuit described above in FIG. 1 in that it is formed as a fully digital PLL. Thus, the PLL circuit of FIG. 9 includes an A/D converter 1a in place of the A/D converter of FIG. 1 and includes an interpolator 8 and an interpolation amount calculator 9 in place of the D/A converter 6 and the voltage controlled oscillator 7.

The A/D converter 1a operates with a clock signal of a fixed rate which has a frequency higher than a channel clock of an input signal. The interpolator 8 performs phase adjustment for a digital signal outputted from the A/D converter 1a. Operation of the delay circuits 2-1 and 2—2, pattern string detector 3, and phase difference generator 4 is fully same as that in the embodiment 1. The loop filter 5 averages the output of the phase difference generator 4. The output of the loop filter 5 is inputted to the interpolation amount calculator 9. The interpolation amount calculator 9 controls the phase adjustment amount of the interpolator 8 based on the output of the loop filter 5. In particular, the interpolation amount calculator 9 and the interpolator 8 perform operation corresponding to the voltage control generator 7 of FIG. 1.

Further, all of the delay circuits 2-1 and 2—2, pattern string detector 3, phase difference generator 4, loop filter 5, interpolator 8, and interpolation amount calculator 9, which are digital circuits, operate with the clock signal of the fixed rate described above. Further, details of the interpolator 8 and the interpolation amount calculator 9 are disclosed in Japanese Patent Application No. 367483/1999.

While a frequency higher than the channel clock must be used to cause the components of the PLL circuit of FIG. 9 to operate, since all of the components can be formed as an LSI, reduction of the cost and the dispersion can be anticipated.

[Embodiment 4]

Figure 10:
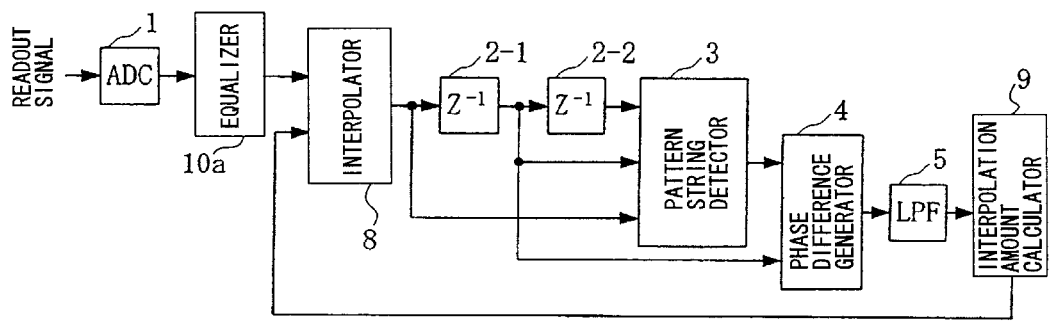

FIG. 10 shows a still further configuration of the PLL circuit to which the present invention is applied. Referring to FIG. 10, the PLL circuit shown is a modification to the PLL circuit described hereinabove with reference to FIG. 9 and includes basically same components as those of the PLL circuit of FIG. 9. However, the present PLL circuit is different from the PLL circuit of FIG. 1 in that it includes an A/D converter 1 in place of the A/D converter 1a and additionally includes an equalizer 10a interposed between the A/D converter 1 and the interpolator 8. The reason why the equalizer 10a is inserted is same as that in the PLL circuit of FIG. 8. While the equalizer 10a can be interposed otherwise between the interpolator 8 and the delay circuit 2-1, since this increases the latency of the entire PLL loop, there is the possibility that the follow-up characteristic may drop. This is conspicuous particularly where the equalizer 10a has a pipeline configuration for high speed operation.

[Embodiment 5]

Figure 11:
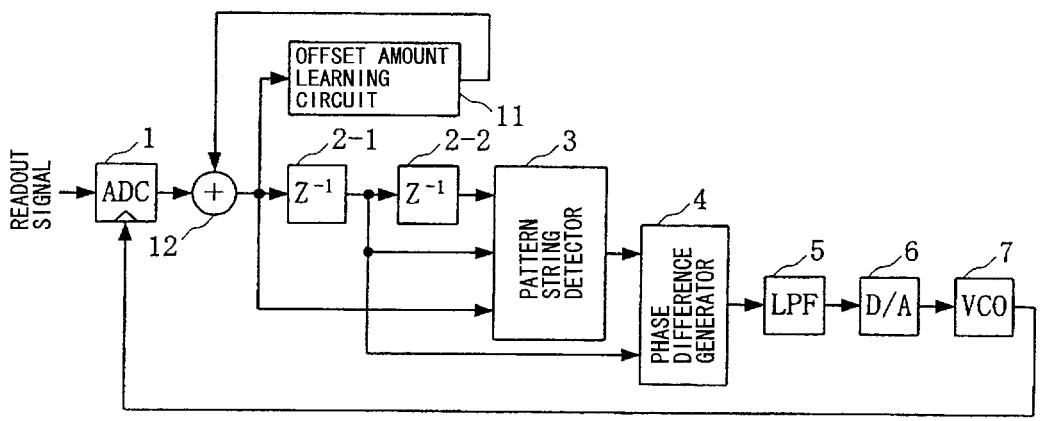

FIG. 11 shows a yet further configuration of the PLL circuit to which the present invention is applied. Referring to FIG. 11, the PLL circuit shown is a modification to the PLL circuit described hereinabove with reference to FIG. 1 and includes all components of the PLL circuit of FIG. 1. However, the present PLL circuit is different from the PLL circuit of FIG. 1 in that it additionally includes an offset amount learning circuit 11 and an adder 12.

A code used by a normal disk apparatus such as an optical disk apparatus or a magnetic disk apparatus is not a DC-free (that is, a DC component is little) code. Further, an offset is sometimes superposed on a readout signal from a defect, an influence of double refraction, part dispersion and so forth.

Therefore, in order to prevent wrong detection of the pattern string detector 3 in such a case as just described, the PLL circuit of FIG. 11 is configured so that the offset amount learning circuit 11 learns an offset correction amount with which the offset amount of output data of the adder 12 is 0 from output data of the adder 12 and feeds it back to the adder 12. The offset amount can be reduced to 0 if the adder 12 adds the offset correction amount from the offset amount learning circuit 11 to the output data of the A/D converter 1. The stability of the PLL can be raised in this manner.

Although the details of the offset amount learning circuit 11 are not shown, the offset amount learning circuit 11 can detect the offset amount by recording data, for example, of a single frequency in advance and then reading out and simply integrating the data. Alternatively, however, another method wherein the offset amount is periodically corrected by using part of header information based on a format rule of data may be used.

It is to be noted that such an offset amount learning circuit and an adder 12 as described above with reference to FIG. 11 may otherwise be incorporated in the PLL circuit of FIG. 8, 9 or 10.

[Embodiment 6]

Figure 12:
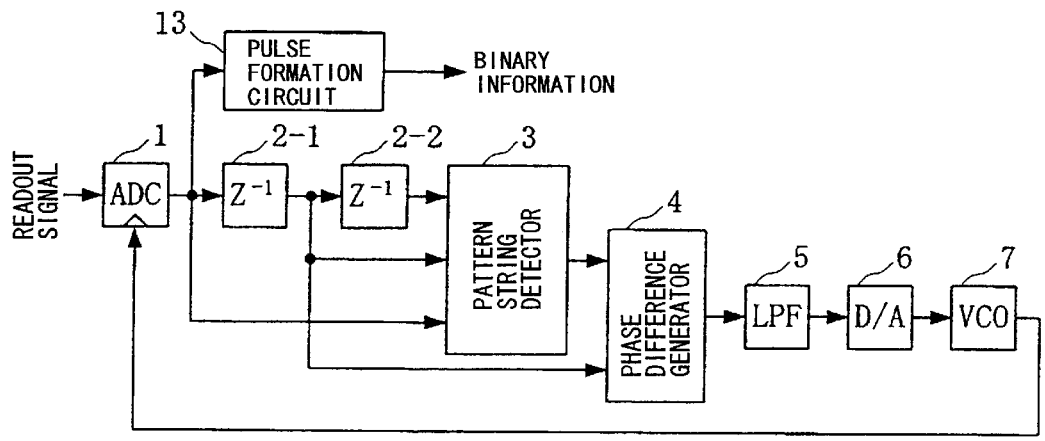
FIGS. 12 and 13 are block diagrams showing different configurations of a data detection circuit to which the present invention is applied.

Although a PLL circuit is often used simply as a clock extraction circuit or a multiplying circuit, it is sometimes incorporated in a data detection circuit. FIG. 12 shows a configuration of a data detection circuit to which the present invention is applied and which includes a PLL circuit having a configuration same as that of the PLL circuit described hereinabove with reference to FIG. 2. Referring to FIG. 12, the data detection circuit further includes a pulse formation circuit 13 which identifies, in synchronism with a clock signal from the voltage control oscillator 7 of the PLL circuit, whether the output data of the A/D converter 1 is 0 or 1 to play back information from a readout signal inputted to the A/D converter 1.

It is to be noted that the PLL circuit described hereinabove with reference to FIG. 8, 9 or 10 may be used in place of the PLL circuit of FIG. 1. Meanwhile, a Viterbi detector may be used as the pulse formation circuit 13. In this instance, it is necessary to set the reference level in the Viterbi detector and the reference level of the pattern string detector 3 equal to each other.

[Embodiment 7]

Figure 13:
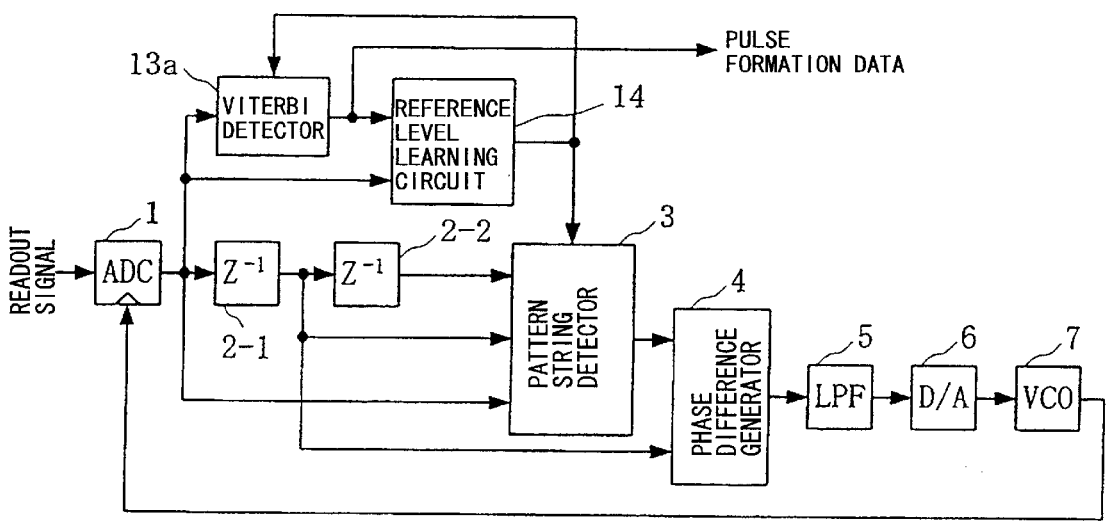

FIG. 13 shows another configuration of the data detection circuit to which the present invention is applied. Referring to FIG. 13, also the data detection circuit of FIG. 13 includes a PLL circuit having a configuration same as that of the PLL circuit of FIG. 1. The present data detection circuit, however, is different from that of FIG. 12 in that it uses a Viterbi detector 13a as the pulse formation circuit 13 of FIG. 12 and additionally includes a reference level learning circuit 14. The reference level learning circuit 14 can monitor an input and an output of the Viterbi detector 13a and correct the reference level adaptively. The reference level corrected by the reference level learning circuit 14 is inputted to the Viterbi detector 13a and the pattern string detector 3.

Consequently, it is possible to correct such non-linearity (asymmetry of the reference level) or the like of a readout signal that varies comparatively slowly, and therefore, more stable information detection can be achieved. A comparatively high-order PR channel is optimal as a playback channel to be inputted. This is because the difference from the conventional PLL method becomes closer as the resolution increases. Particularly, the PR (a, b, b, a) or PR (a, b, c, b, a) type is optimal to the playback channel.

Figure 14:
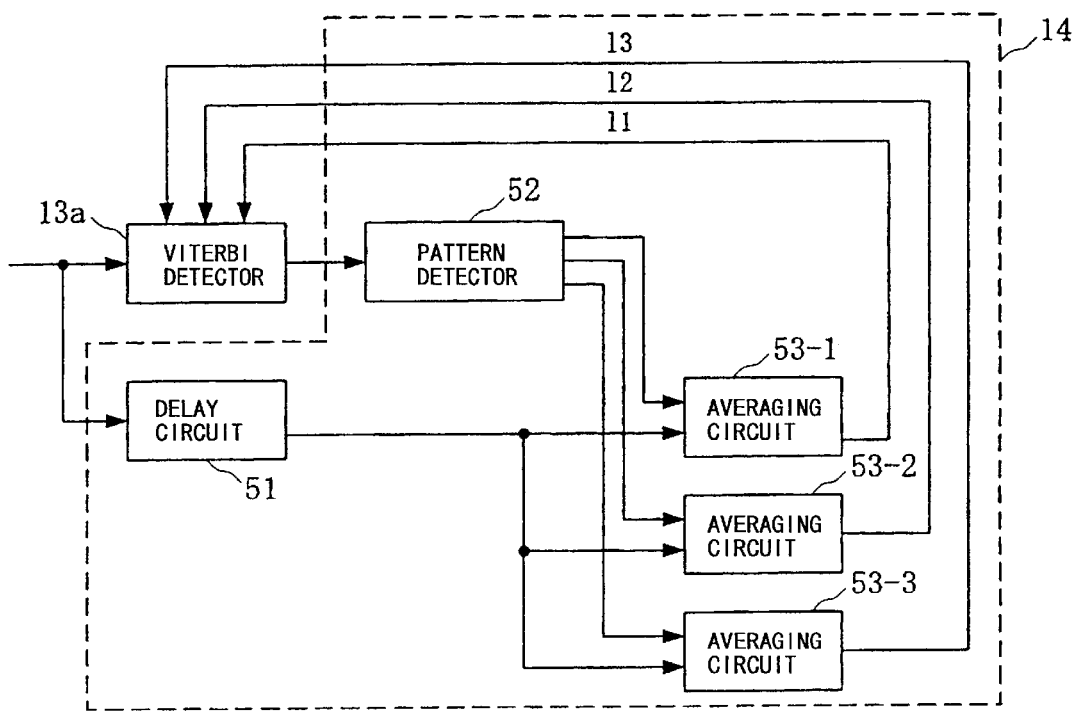
FIG. 14 is a block diagram showing a configuration of a reference level learning circuit of the data detection circuit of FIG. 13.

FIG. 14 shows an example of a configuration of the reference level learning circuit 14. Referring to FIG. 14, a delay circuit 51 delays a digital signal outputted from the A/D converter 1.

A pattern detector 52 detects to which one of 1, 0 and −1 the amplitude level of the output of the Viterbi detector 13a is nearest (it is to be noted that the amplitude levels 1, 0, and −1 are those in the case of the PR channel (1, 1) and d=1 limitation code).

Averaging circuits 53-1 to 53-3 correspond to the amplitude levels 1, 0 and −1 and output reference levels 11, 12 and 13, respectively. The pattern detector 52 outputs, when the amplitude level of the output of the Viterbi detector 13a is nearest to 1, a signal "1" to the averaging circuit 53-1 and outputs a signal "0" to the averaging circuits 53-2 and 53-3. However, the pattern detector 52 outputs, when the amplitude level of the output of the Viterbi detector 13a is nearest to 0, a signal "1" to the averaging circuit 53-2 and outputs a signal "0" to the averaging circuits 53-1 and 53-3. On the other hand, the pattern detector 52 outputs, when the amplitude level of the output of the Viterbi detector 13a is nearest to −1, a signal "1" to the averaging circuit 53-3 and outputs a signal "0" to the averaging circuits 53-1 and 53-2.

The averaging circuits 53-1 to 53-3 integrate, when the output signal of the pattern detector 52 is "1", the output signal of the delay circuit 51 and output a result of the integration (a result when the output signal of the delay circuit 51 is added to an integration result till then is outputted). Further, the average circuits 53-1 to 53-3 disregard, when the output signal of the pattern detector 52 is "0", the output signal of the delay circuit 51 and do not perform integration operation (the integration results till then are outputted as they stand). Thus, the reference levels 11, 12, and 13 are inputted to the Viterbi detector 13a.

It is to be noted that the PLL circuit of FIG. 8, 9 or 10 may be used in place of the PLL circuit of FIG. 1.

[Embodiment 8]

Figure 15:
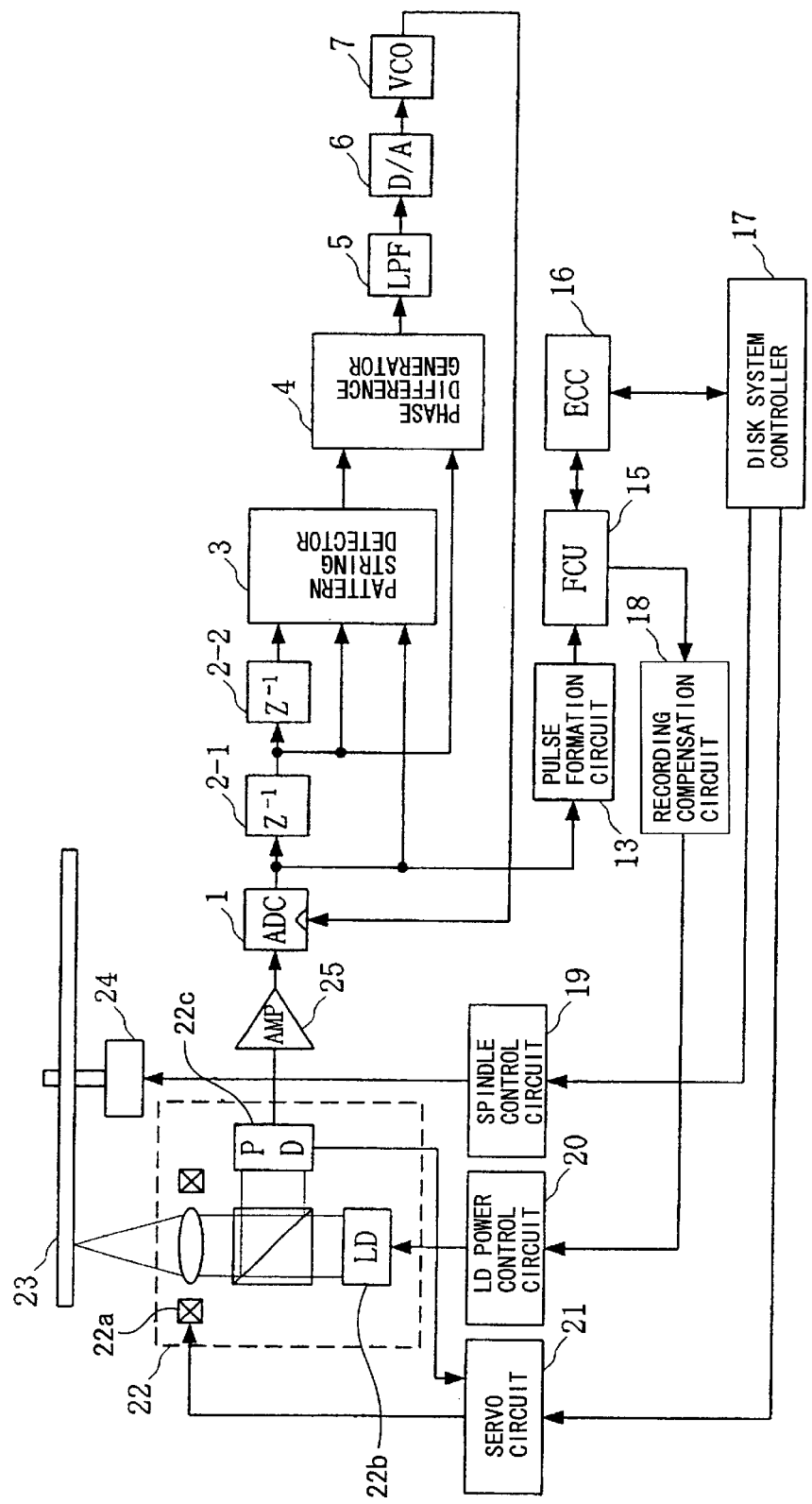
FIG. 15 is a block diagram showing a configuration of a disk apparatus to which the present invention is applied.
Figure 16:
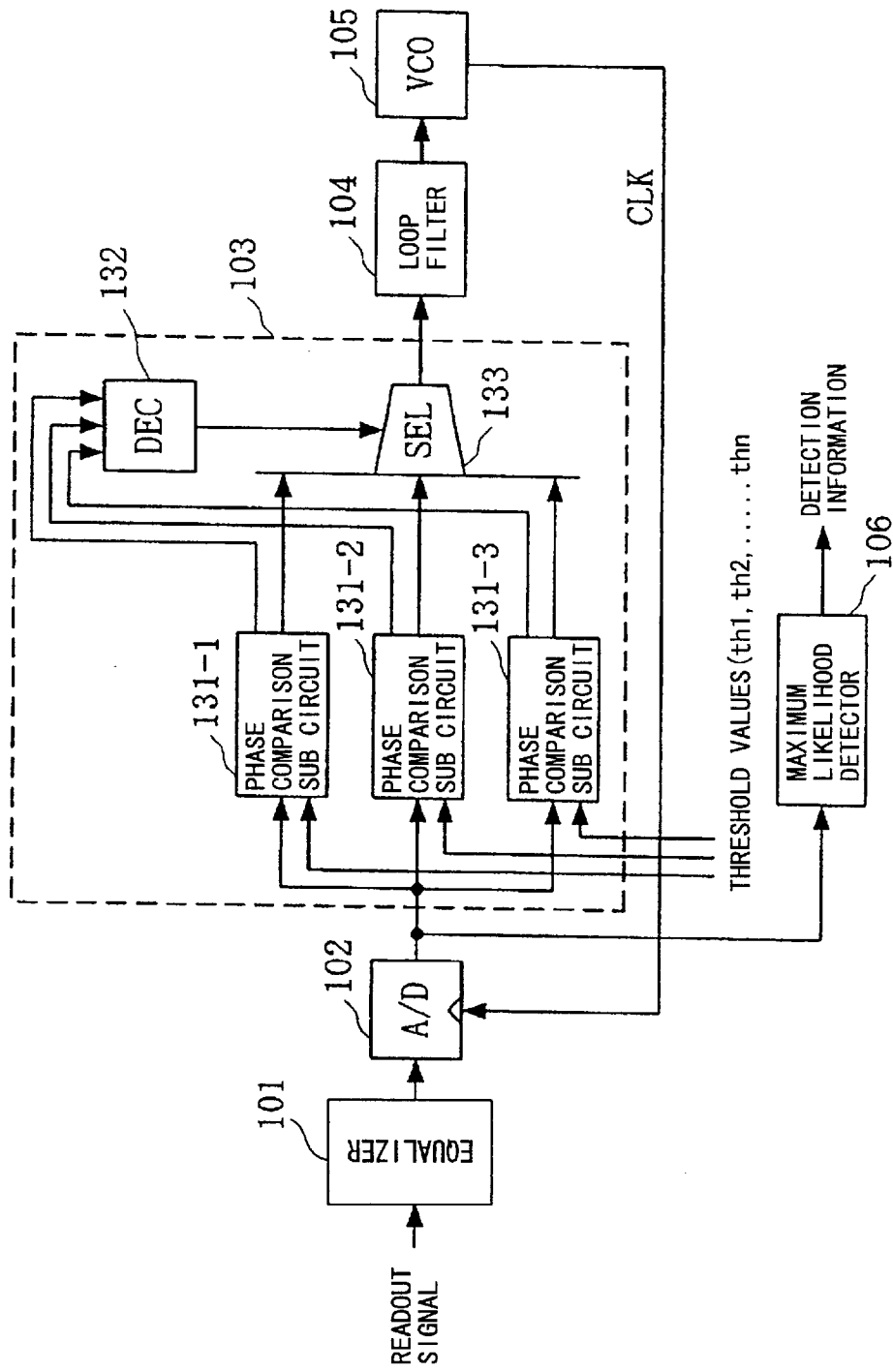
FIG. 16 is a block diagram showing a configuration of a conventional PLL circuit.
Figure 17:
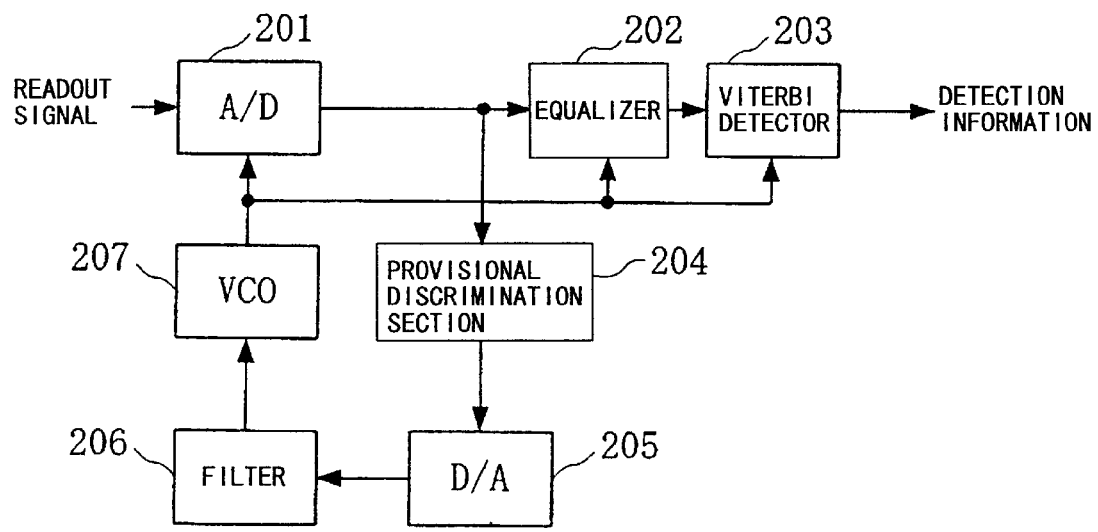
FIG. 17 is a block diagram showing a configuration of another conventional PLL circuit.

FIG. 15 shows a configuration of a disk apparatus to which the present invention is applied. Referring to FIG. 15, the disk apparatus shown incorporates the data detection circuit described above with reference to FIG. 12. Operation of the disk apparatus is described below.

First, in order that a laser beam irradiated from an optical head 22 upon an optical disk medium 23 may be accurately converged on the optical disk medium 23 to allow a laser spot to follow up a track on the optical disk medium 23, an actuator servo circuit 21 controls an actuator 22a for driving a lens in the optical head 22. An LD power control circuit 20 controls the intensity of the laser beam outgoing from a laser diode 22b in the optical head 22 so as to be kept fixed. A spindle control circuit 19 controls a spindle motor 24 so that the optical disk medium 23 rotates at a fixed speed.

The spindle control circuit 19, LD power control circuit 20 and actuator servo circuit 21 are controlled by a disk system controller 17. Reflected light from the optical disk medium 23 is received and converted into an electric signal by a photo diode 22c in the optical head 22. A preamplifier 25 amplitudes the output signal of the photo diode 22c. The A/D converter 1 converts the output signal (readout signal) of the preamplifier 25 into a digital signal.

The sampling timing of the A/D converter 1 is controlled by the PLL circuit described above with reference to FIG. 1 based on the output of the A/D converter 1. Further, information is played back from within the readout signal by the pulse formation circuit 13 described hereinabove with reference to FIG. 12, and data demodulation and so forth are performed by a format controller 15. An output of the format controller 15 is inputted to an error correction circuit 16, by which error correction is performed. The error-corrected data by the error correction circuit 16 are finally inputted to the disk system controller 17 and outputted to the outside through an interface not shown. The foregoing is operation upon data readout.

Upon data recording, the disk apparatus operates in a procedure reverse to that upon data readout. In particular, data to be recorded are transmitted to the disk system controller 17, and redundant bits for error correction are added to the data by the error correction circuit 16. The format controller 15 performs data modulation for the output data of the error correction circuit 16. A recording compensation circuit 18 modulates the light emission power of the laser diode 22b in the optical head 22 in accordance with the modulated data under the control of the LD power control circuit 20. Consequently, a mark is formed on the optical disk medium 23. It is to be noted that, while an example of the configuration of the optical disk apparatus is described above, apparently the present invention can be applied also to a magnetic disk apparatus. Further, as described with reference to FIG. 12, the PLL circuit of FIG. 8, 9 or 10 may be used as the PLL circuit in the data detection circuit.

While preferred embodiments of the present invention have been described using specific terms, such description is for illustrative purposes only, and it is to be understood that changes and variations may be made without departing from the spirit or scope of the following claims.

What is claimed is:

1. A PLL circuit for generating a clock signal from an input analog signal, comprising:
    an A/D converter for sampling the input analog signal to produce a digital signal;
    a pattern string detector for identifying a type of an input pattern string formed from a plurality of successive sample values successively outputted from said A/D converter and outputting pattern string identification information which indicates an identification result;
    a phase difference generator for outputting phase difference information which indicates a phase error of the output of said A/D converter based on the pattern string identification information and the output of said A/D converter; and
    a clock signal generator for generating a clock signal from the phase difference information to control the sampling timing of said A/D converter, wherein said A/D converter, said pattern string detector, said phase difference generator, and said clock signal generator are connected in a loop.

2. A PLL circuit as claimed in claim 1, further comprising an analog equalizer provided in the preceding stage to said A/D converter for performing waveform equalization of the input analog signal.

3. A PLL circuit as claimed in claim 1, wherein said pattern string detector includes an error generator for calculating error amounts between the input pattern string and all of ideal pattern strings which the input pattern string can assume, and a minimum value detector for outputting the pattern string identification information representing that the ideal pattern string whose calculated error amount is minimum is an ideal pattern string nearest to the input pattern string.

4. A PLL circuit as claimed in claim 3, wherein said phase difference generator includes a first memory for storing in advance an ideal value within each of the ideal pattern strings and outputting, when the pattern string identification information is inputted, an ideal value corresponding to the ideal pattern string identification information, and a second memory for storing in advance a differential coefficient of each of the ideal values and outputting, when the pattern string identification information is inputted, a coefficient corresponding to the ideal pattern string identification information, a subtractor for subtracting the ideal value outputted from said first memory from the output of said A/D converter, and a multiplier for multiplying an output of said subtractor by the differential coefficient outputted from said second memory and outputting a result of the multiplication as the phase difference information.

5. A PLL circuit as claimed in claim 1, further comprising:
    an adder provided between said A/D converter and said pattern string detector and phase difference generator for adding an offset correction amount to the output of said A/D converter and outputting a result of the addition to said pattern string detector and said phase difference generator; and
    an offset amount learning circuit for learning the offset correction amount to be used to correct the offset amount of the output of said adder from the output of said adder and supplying the learned offset correction amount to said adder.

6. A PLL circuit for generating a clock signal from an input analog signal, comprising:
    an A/D converter for sampling the input analog signal at a fixed clock rate to produce a digital signal;
    an interpolator for adjusting the phase of the digital signal;
    a pattern string detector for identifying a type of an input pattern string formed from a plurality of successive data values successively outputted from said interpolator and outputting pattern string identification information which indicates an identification result;
    a phase difference generator for outputting phase difference information which indicates a phase error of the output of said interpolator based on the pattern string identification information and the output of said interpolator; and
    an interpolation amount calculator for controlling the phase adjustment amount of said interpolator based on the phase difference information, wherein said interpolator, said pattern string detector, said phase difference generator, and said interpolation amount calculator are connected in a loop.

7. A PLL circuit as claimed in claim 6, further comprising a digital equalizer provided between said A/D converter and said interpolator for performing waveform equalization of the output signal of said A/D converter.

8. A PLL circuit as claimed in claim 6, wherein said pattern string detector includes an error generator for calculating error amounts between the input pattern string and all of ideal pattern strings which the input pattern string can assume, and a minimum value detector for outputting the pattern string identification information representing that the ideal pattern string whose calculated error amount is minimum is an ideal pattern string nearest to the input pattern string.

9. A PLL circuit as claimed in claim 8, wherein said phase difference generator includes a first memory for storing in advance an ideal value within each of the ideal pattern strings and outputting, when the pattern string identification information is inputted, an ideal value corresponding to the ideal pattern string identification information, and a second memory for storing in advance a differential coefficient of each of the ideal values and outputting, when the pattern string identification information is inputted, a coefficient corresponding to the ideal pattern string identification information, a subtractor for subtracting the ideal value outputted from said first memory from the output of said interpolator, and a multiplier for multiplying an output of said subtractor by the differential coefficient outputted from said second memory and outputting a result of the multiplication as the phase difference information.

10. A PLL circuit as claimed in claim 6, further comprising:
an adder provided between said A/D converter and said pattern string detector and phase difference generator for adding an offset correction amount to the output of said A/D converter and outputting a result of the addition to said pattern string detector and said phase difference generator; and
an offset amount learning circuit for learning the offset correction amount to be used to correct the offset amount of the output of said adder from the output of said adder and supplying the learned offset correction amount to said adder.

11. A data detection circuit, comprising:
a PLL circuit including;
an A/D converter for sampling the input analog signal to produce a digital signal,
a pattern string detector for identifying a type of an input pattern string formed from a plurality of successive sample values successively outputted from said A/D converter and outputting pattern string identification information which indicates an identification result,
a phase difference generator for outputting phase difference information which indicates a phase error of the output of said A/D converter based on the pattern string identification information and the output of said A/D converter,
a clock signal generator for generating a clock signal from the phase difference information to control the sampling timing of said A/D converter; and
a pulse formation circuit for identifying information within the output signal of said A/D converter in synchronism with the clock signal generated by said PLL circuit or the clock signal of the fixed clock, wherein said A/D converter, said pattern string detector, said phase difference generator, and said clock signal generator are connected in a loop.

12. A data detection circuit as claimed in claim 11, wherein said pulse formation circuit includes a Viterbi detector.

13. A data detection circuit as claimed in claim 12, further comprising a reference level learning circuit for learning a reference level of said Viterbi detector from the input and output of said Viterbi detector and outputting the learned reference level to said Viterbi detector and said pattern string detector.

14. A data detection circuit as claimed in claim 12, wherein said Viterbi detector is ready for a PR (a, b, b, a) channel.

15. A data detection circuit as claimed in claim 12, wherein said Viterbi detector is ready for a PR (a, b, c, b, a) channel.

16. A data detection circuit, comprising:
a PLL circuit including:
an A/D converter for sampling the input analog signal at a fixed clock rate to produce a digital signal,
an interpolator for adjusting the phase of the digital signal,
a pattern string detector for identifying a type of an input pattern string formed from a plurality of successive data values successively outputted from said interpolator and outputting pattern string identification information which indicates an identification result,
a phase difference generator for outputting phase difference information which indicates a phase error of the output of said interpolator based on the pattern string identification information and the output of said interpolator,
an interpolation amount calculator for controlling the phase adjustment amount of said interpolator based on the phase difference information; and
a pulse formation circuit for identifying information within the output signal of said A/D converter in synchronism with the clock signal generated by said PLL circuit or the clock signal of the fixed clock, wherein said interpolator, said pattern string detector, said phase difference generator, and said interpolation amount calculator are connected in a loop.

17. A data detection circuit as claimed in claim 16, wherein said pulse formation circuit includes a Viterbi detector.

18. A data detection circuit as claimed in claim 17, further comprising a reference level learning circuit for learning a reference level of said Viterbi detector from the input and output of said Viterbi detector and outputting the learned reference level to said Viterbi detector and said pattern string detector.

19. A data detection circuit as claimed in claim 17, wherein said Viterbi detector is ready for a PR (a, b, b, a) channel.

20. A data detection circuit as claimed in claim 17, wherein said Viterbi detector is ready for a PR (a, b, c, b, a) channel.

21. A magnetic disk apparatus, comprising:
magnetic reading means for magnetically reading data from a magnetic disk and outputting the read data as an analog signal; and
a data detection circuit including:
a PLL circuit which in turn includes:
an A/D converter for sampling the analog signal from said magnetic reading means to produce a digital signal,
a pattern string detector for identifying a type of an input pattern string formed from a plurality of successive sample values successively outputted from said A/D converter and outputting pattern string identification information which indicates an identification result,
a phase difference generator for outputting phase difference information which indicates a phase error of the output of said A/D converter based on the pattern string identification information and the output of said A/D converter, and
a clock signal generator for generating a clock signal from the phase difference information to control the sampling timing of said A/D converter, and
a pulse formation circuit for identifying information within the output signal of said A/D converter in synchronism with the clock signal generated by said PLL circuit or the clock signal of the fixed clock, wherein said A/D converter, said pattern string detector, said phase difference generator, and said clock signal generator are connected in a loop.

22. A magnetic disk apparatus as claimed in claim 21, wherein said pulse formation circuit includes a Viterbi detector.

23. A magnetic disk apparatus as claimed in claim 22, wherein said data detection circuit further includes a reference level learning circuit for learning a reference level of said Viterbi detector from the input and output of said Viterbi detector and outputting the learned reference level to said Viterbi detector and said pattern string detector.

24. A magnetic disk apparatus, comprising:
magnetic reading means for magnetically reading data from a magnetic disk and outputting the read data as an analog signal; and
a data detection circuit including:
   a PLL circuit which in turn includes:
      an A/D converter for sampling the analog signal from said magnetic reading means at a fixed clock rate to produce a digital signal,
      an interpolator for adjusting the phase of the digital signal,
      a pattern string detector for identifying a type of an input pattern string formed from a plurality of successive data values successively outputted from said interpolator and outputting pattern string identification information which indicates an identification result,
      a phase difference generator for outputting phase difference information which indicates a phase error of the output of said interpolator based on the pattern string identification information and the output of said interpolator,
      an interpolation amount calculator for controlling the phase adjustment amount of said interpolator based on the phase difference information, and
      a pulse formation circuit for identifying information within the output signal of said A/D converter in synchronism with the clock signal generated by said PLL circuit or the clock signal of the fixed clock, wherein said interpolator, said pattern string detector, said phase difference generator, and said interpolation amount calculator are connected in a loop.

25. A magnetic disk apparatus as claimed in claim 24, wherein said pulse formation circuit includes a Viterbi detector.

26. A magnetic disk apparatus as claimed in claim 25, wherein said data detection circuit further includes a reference level learning circuit for learning a reference level of said Viterbi detector from the input and output of said Viterbi detector and outputting the learned reference level to said Viterbi detector and said pattern string detector.

27. An optical disk apparatus, comprising:
optical reading means for optically reading data from an optical disk and outputting the read data as an analog signal; and
a data detection circuit including:
   a PLL circuit which in turn includes an A/D converter for sampling the analog signal from said optical reading means to produce a digital signal,
   an interpolator for adjusting the phase of the digital signal,
   a pattern string detector for identifying a type of an input pattern string formed from a plurality of successive data values successively outputted from said interpolator and outputting pattern string identification information which indicates an identification result,
   a phase difference generator for outputting phase difference information which indicates a phase error of the output of said interpolator based on the pattern string identification information and the output of said interpolator,
   an interpolation amount calculator for controlling the phase adjustment amount of said interpolator based on the phase difference information, and
   a pulse formation circuit for identifying information within the output signal of said A/D converter in synchronism with the clock signal generated by said PLL circuit or the clock signal of the fixed clock, wherein said interpolator, said pattern string detector, said phase difference generator, and said interpolation amount calculator are connected in a loop.

28. An optical disk apparatus as claimed in claim 27, wherein said pulse formation circuit includes a Viterbi detector.

29. An optical disk apparatus as claimed in claim 28, wherein said data detection circuit further includes a reference level learning circuit for learning a reference level of said Viterbi detector from the input and output of said Viterbi detector and outputting the learned reference level to said Viterbi detector and said pattern string detector.

30. An optical disk apparatus, comprising:
optical reading means for optically reading data from an optical disk and outputting the read data as an analog signal; and
a data detection circuit including;
   a PLL circuit which in turn includes an A/D converter for sampling the analog signal from said optical reading means at a fixed clock rate to produce a digital signal,
   an interpolator for adjusting the phase of the digital signal,
   a pattern string detector for identifying a type of an input pattern string formed from a plurality of successive data values successively outputted from said interpolator and outputting pattern string identification information which indicates an identification result,
   a phase difference generator for outputting phase difference information which indicates a phase error of the output of said interpolator based on the pattern string identification information and the output of said interpolator,
   an interpolation amount calculator for controlling the phase adjustment amount of said interpolator based on the phase difference information, and
   a pulse formation circuit for identifying information within the output signal of said MD converter in synchronism with the clock signal generated by said PLL circuit or the clock signal of the fixed clock, wherein said interpolator, said pattern string detector, said phase difference generator, and said interpolation amount calculator are connected in a loop.

31. An optical disk apparatus as claimed in claim 30, wherein said pulse formation circuit includes a Viterbi detector.

32. An optical disk apparatus as claimed in claim 31, wherein said data detection circuit further includes a reference level learning circuit for learning a reference level of said Viterbi detector from the input and output of said Viterbi detector and outputting the learned reference level to said Viterbi detector and said pattern string detector.

* * * * *

UNITED STATES PATENT AND TRADEMARK OFFICE
CERTIFICATE OF CORRECTION

PATENT NO. : 6,788,484 B2
DATED : September 7, 2004
INVENTOR(S) : Honma

It is certified that error appears in the above-identified patent and that said Letters Patent is hereby corrected as shown below:

Column 18,
Line 51, "said MD converter" should be -- said A/D converter --.

Signed and Sealed this

Twenty-fifth Day of January, 2005

JON W. DUDAS
*Director of the United States Patent and Trademark Office*